(12) United States Patent
Griffin et al.

(10) Patent No.: US 6,400,176 B1
(45) Date of Patent: Jun. 4, 2002

(54) CONSTANT CMOS DRIVER

(75) Inventors: Jed Griffin, Forest Grove; Ernest Khaw, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,425

(22) Filed: Dec. 30, 1999

Related U.S. Application Data (63) Continuation-in-part of application No. 09/108,606, filed on Jul. 1, 1998.

(51) Int. Cl.[7] ............................................. H03K 17/16
(52) U.S. Cl. ........................ 326/30; 326/86; 327/108
(58) Field of Search ............................... 326/30, 83, 85, 326/86, 87, 27, 112, 119, 121, 122; 327/111, 112, 389, 108, 384

(56) References Cited

U.S. PATENT DOCUMENTS

| | | | | |
|---|---|---|---|---|
| 5,361,003 A | * | 11/1994 | Roberts | .................. 326/21 |
| 5,732,027 A | * | 3/1998 | Arcoleo et al. | ........ 365/189.05 |
| 5,959,473 A | * | 9/1999 | Sakuragi | .................. 327/111 |
| 6,097,223 A | * | 8/2000 | Loughmiller | ............ 327/112 |
| 6,137,317 A | * | 10/2000 | Griffin | ...................... 326/87 |

* cited by examiner

*Primary Examiner*—Michael Tokar
*Assistant Examiner*—Daniel D. Chang
(74) *Attorney, Agent, or Firm*—Blakely, Sokoloff, Taylor & Zafman LLP (57) ABSTRACT

According to one aspect of the invention, a circuit is provided that includes a drive stage having an input and output node, and at least one transistor coupled between the two nodes. An upper impedance element coupled at one end to the output node and at another end to an upper supply node is provided. The upper impedance element has a stack of transistors each having a beta matched to a beta of at least one transistor in the drive stage. A lower impedance element coupled at one end to the output node and at another end to a lower supply node is provided. The lower impedance element has a stack of transistors each having a beta matched to the beta of at least one transistor in the drive stage. In another embodiment, a circuit is provided that includes a plurality of transistors coupled in parallel between a supply node and a pre-drive stage. The plurality of transistors each have a gate coupled to a delay select line to control current through the pre-drive stage.

21 Claims, 6 Drawing Sheets

CONSTANT CMOS DRIVER

This is a continuation in part application to U.S. Pat. Ser. No. 09/108,606 filed on Jul. 1, 1998.

BACKGROUND OF THE INVENTION

1. Field of the Invention

Embodiments of the present invention relate to driver circuits for driving transmission lines, and more particularly to complementary metal oxide semiconductor (CMOS) driver circuits.

2. Background

A dominant limitation of conventional manufactured driver circuits is their artificially low transmission rates due to widely varying operating conditions, such as voltage, temperature, and process variation. Due to varied operating conditions, the propagation delay and the output impedance of drivers varies widely, thus, hampering impedance matching.

Propagation delay can vary typically by a factor of two to three across two extreme operating conditions. This variation of propagation delay seriously impacts system timing at higher frequencies. Without a constant delay across all operating conditions, system timing is adversely impaired such that timing margins have to be introduced to handle any delay time variations due to varying operating conditions.

A most common and useful communication topology is peer-to-peer connections with full duplex transmission. To achieve optimal impedance matching in this type of topology, the output impedance of the transmitting side must match the characteristic impedance of the transmission line. Impedance matching at the transmitting end has traditionally been accomplished by placing a series resistor between the output driver and the transmission line. For this method to work, the output impedance of the output driver must be kept much lower than the characteristic impedance of the transmission line. This results in a much higher cost in area and power than required for merely transmitting a signal. Moreover, impedance matching is degraded due to varying resistance across operating conditions and the non-linearity of the driver. Another method is to use the nonlinear transistors of the output driver to approximate the linear characteristic impedance of the transmission line. This attempt, however, results in even worse impedance matching than a series resistor placed at the transmitting end.

Figure 1:
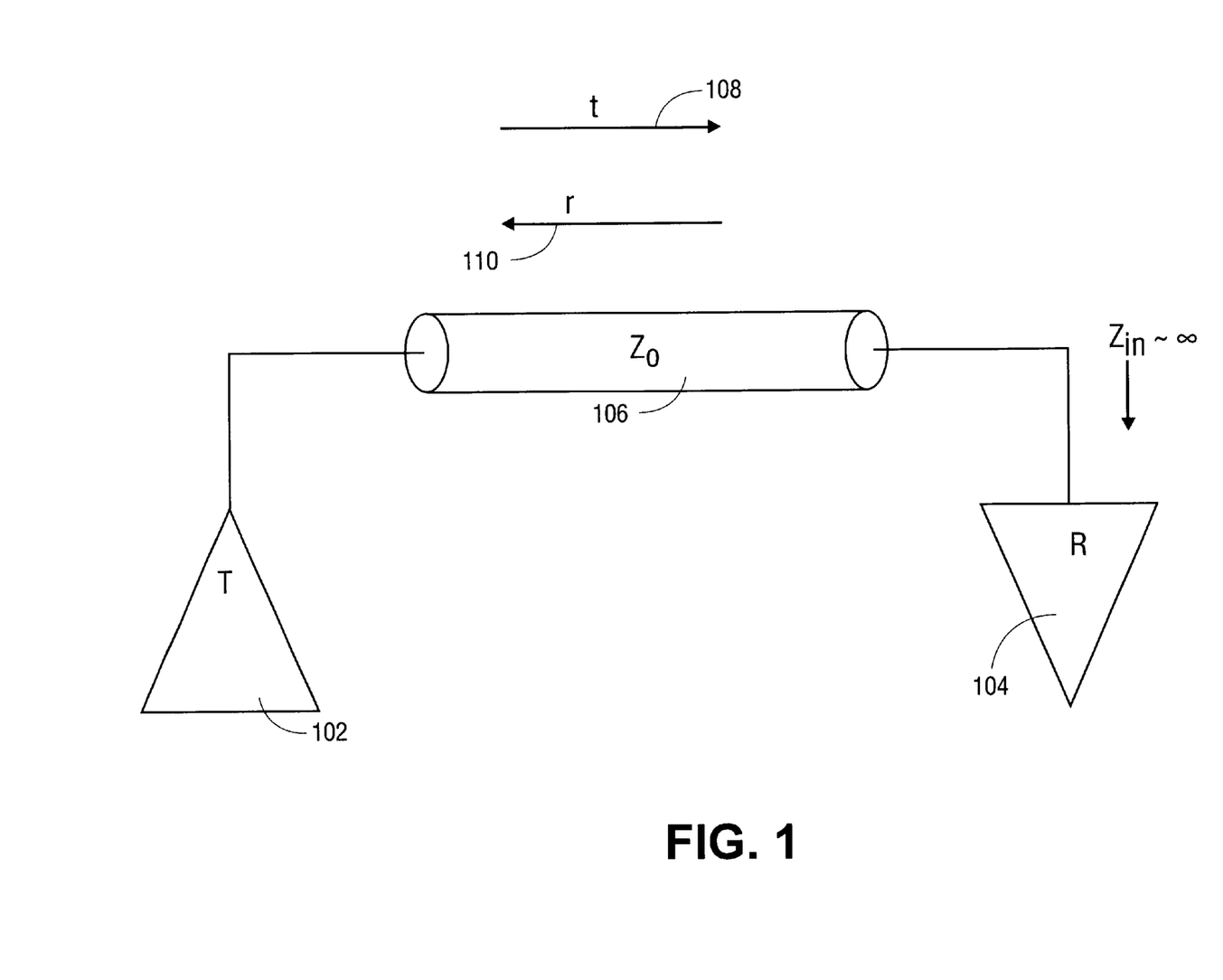
FIG. 1 is an illustration of a driver in communication with a receiver over a transmission line, where the receiver is not matched to the transmission line.

FIG. 1 illustrates an I/O (input/output) driver 102 communicating with a receiver 104 via a transmission line 106. The transmission line 106 has a characteristic impedance $Z_o$, and may be the physical layer of a bus. The driver 102 and the receiver 104 are complementary metal oxide semiconductor (CMOS) circuits. For purposes of mathematical analysis, the input impedance ($Z_{in}$) of the receiver 104 is approximated as being infinite relative to other impedances in the circuit. The receiver 104 may be one or more CMOS logic gates, or a differential amplifier.

The driver 102 is transmitting an electromagnetic wave travelling in the transmit direction 108. If $Z_{in}$ of the receiver 104 is not equal to $Z_o$, then a reflected wave will propagate in the receiver direction 110. If the impedance of the driver 102 is not matched to the characteristic impedance $Z_o$, then another reflected wave will again be generated, but now travelling in the transmit direction 108. There will be many multiple reflections, and the electric and magnetic field vectors at any point along the transmission line 106 is the vector sum (superposition) of the transmitted field vector and all reflected field vectors at that point. This superposition of the transmitted wave and the reflected waves may cause signal degradation, which typically limits, for longer transmission lines, the speed at which digital data is reliably transmitted from the driver 102 to the receiver 104.

The first reflected wave can be reduced by terminating the receiving end of the transmission line 106 with a receiver or stub having an impedance matched to $Z_o$. This may, however, require the use of an off-chip resistor, and furthermore, power may be wasted due to ohmic losses in the resistor. Another negative impact of impedance matching at the receiver end is loss of amplitude, potentially halving the amplitude, which can then make the transmitting signal susceptible to noise.

SUMMARY

According to one aspect of the invention, a circuit is provided that includes a drive stage having an input and output node, and at least one transistor coupled between the two nodes. An upper impedance element coupled at one end to the output node and at another end to an upper supply node is provided. The upper impedance element has a stack of transistors each having a beta matched to a beta of at least one transistor in the drive stage. A lower impedance element coupled at one end to the output node and at another end to a lower supply node is provided. The lower impedance element has a stack of transistors each having a beta matched to the beta of at least one transistor in the drive stage.

In another embodiment, a circuit is provided that includes a plurality of transistors coupled in parallel between a supply node and a pre-drive stage. The plurality of transistors each have a gate coupled to a delay select line to control current through the pre-drive stage (a stage before the output driver, i.e., coupled to the input node of the driver).

DETAILED DESCRIPTION OF THE INVENTION

Embodiments are described for input/output (I/O) drivers having an output impedance that is approximately independent of the output voltage, and which can be adjusted based upon variations in temperature, supply rail voltage, and variations in transistor dimensions (channel length, width, etc.). This allows for matching the driver's output impedance with the characteristic impedance of a transmission line driven by the I/O driver. If the output impedance is matched to the impedance of the transmission line, an electromagnetic wave that is reflected toward the driver will substantially cease from reflecting again. Therefore, signal degradation is reduced, thus, allowing for faster, more reliable data transmission.

Relevant terminology will first be introduced. Two element Boolean algebra is relevant to switching circuits. For any point in a circuit, the term LOW will denote a set of voltages that map into one of the two Boolean elements. The term HIGH will denote a set of voltages that map into the other of the two Boolean elements. The particular mapping into Boolean elements depends upon the technology used, and may be different for different parts of a single circuit. To avoid dealing with set terminology, we shall say that a voltage is LOW/HIGH if it belongs to the set LOW/HIGH. We also follow the convention that for any given node within a circuit, LOW voltages are generally less than HIGH voltages.

Figure 2:
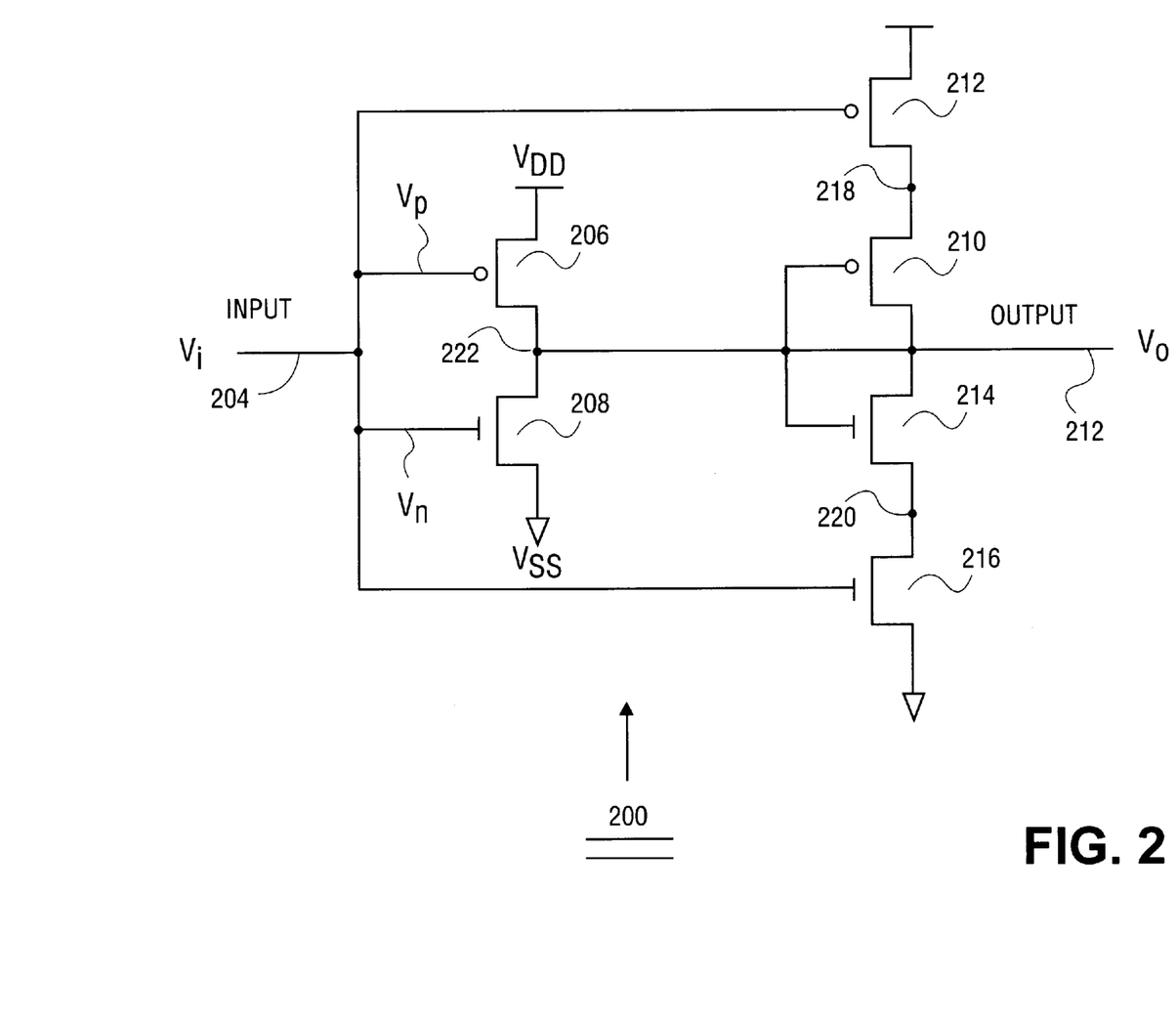
FIG. 2 is an embodiment of the present invention.

A circuit 200 in FIG. 2 is part of an I/O driver or buffer suitable for driving a transmission line. The circuit 200 provides an approximately constant output impedance when the transmission line is being driven. That is, the impedance of the circuit 200, when "looking into" a port defined by the terminal 202 and power supply ground is approximately constant when the transmission line is being driven by the circuit 200.

Transistor set 206 and 212 and transistor set 208 and 216 are switched in complementary fashion with respect to each other to drive the transmission line. The circuit 200 is shown in FIG. 1 without the capability to tristate the output node 202 because $V_n$ and $V_p$ are shorted to the input node 204. In some embodiments, however, they are approximately synchronous, and $V_p$ and $V_n$ are such that $V_p$ transitions from HIGH to LOW before $V_n$ transitions from HIGH to LOW, and $V_p$ transitions from LOW to HIGH after $V_n$ transitions from LOW to HIGH, so that p-channel metal oxide semiconductor field effect transistor (pMOSFET) set 206 and 212, and n-channel metal oxide semiconductor field effect transistor (nMOSFET) set 208 and 216 are not simultaneously ON. Circuit 200 can be tristated if $V_p$ is set HIGH and $V_n$ is set LOW. Note that transistors 212 and 210 are considered a stack of pMOSFETs, and transistors 214 and 216 are considered a stack of pMOSFETs, where a stack of transistors consists of at least two transistors that are stacked together.

The combination of 200 is such that, when $V_p$ and $V_n$ are both LOW the drain of pMOSFET 206 is approximately at the output voltage $V_o$ and nMOSFET 208 is OFF; the drain of pMOSFET 210 is approximately at the output voltage $V_o$ and nMOSFET 214 is OFF; and pMOSFET 212 is ON and nMOSFET 216 is OFF. When $V_p$ and $V_n$ are both HIGH, the drain of nMOSFET 208 is approximately at the output voltage $V_o$, and pMOSFET 206 is OFF; the drain of nMOSFET 214 is approximately at the output voltage $V_o$, and pMOSFET 210 is OFF; and nMOSFET 216 is off and its drain is approximately zero volts (ground) and pMOSFET 212 is OFF. Transistors 206 and 208 are considered to be the drive-stage of circuit 200.

Figure 3A:
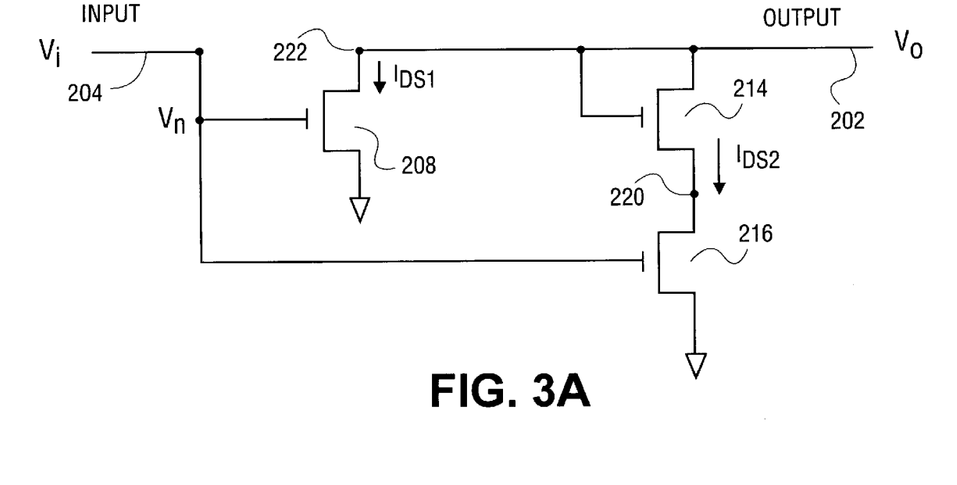
FIG. 3a and 3b are approximations to the embodiment of FIG. 2 for two particular sets of conditions.
Figure 3B:
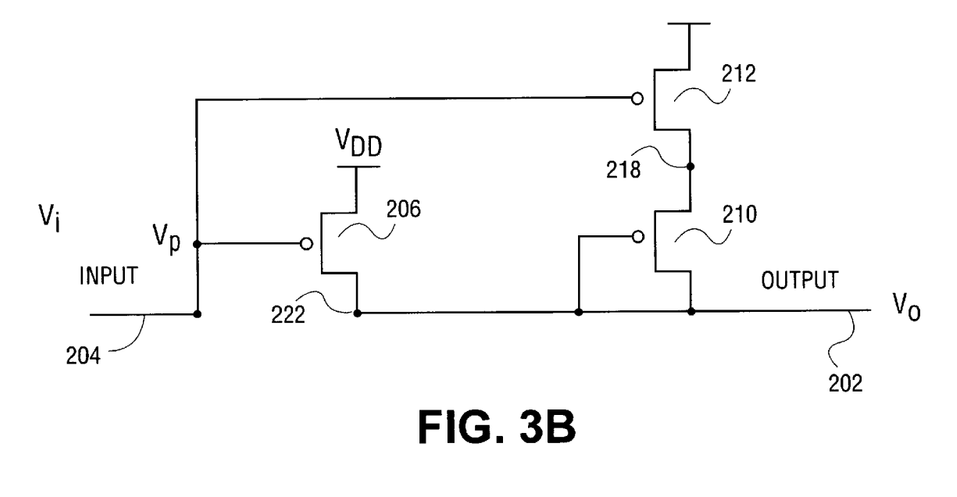

The approximate constant output impedance property of circuit 200 can be understood by considering FIGS. 3a and 3b, which provide approximations to FIG. 2 for the cases in which $V_p$ and $V_n$ are both LOW and in which $V_p$ and $V_n$ are both HIGH, respectively. The circuits of FIGS. 3a and 3b, however, do not model circuit 200 during logic transitions of voltages $V_p$ and $V_n$.

For purposes of finding an approximate expression for the output impedance of the circuit in FIG. 3a when transistors 208, 214, and 216 are ON, let $I_{ds1}$ denote the drain-source current of nMOSFET 208, and $I_{ds2}$ denote the drain-source current between nMOSFETs 216 and 214. Let $Z_{out}$ denote the output impedance of the circuit of FIG. 3a. Then the output impedance is given by $$V_O = Z_{out}(I_{ds1} + I_{ds2}).$$

Noting that the drain-source voltage ($V_{DS}$) of nMOSFET 208 is equal to $V_o$, and assuming that the threshold voltage of nMOSFET 208 is much less than the supply node $V_{DD}$, then an approximate expression for the drain-source current of nMOSFET 208 is given by $$I_{ds1} = \frac{\beta_1}{2}[2V_{DD}V_o - V_o^2]$$

Where $\beta_1$ is the beta for nMOSFET 208 and we assume that nMOSFET 208 is in its linear or nonsaturation region. Transistors nMOSFET 214 and 216 are configured to be in their saturation region when ON, and provided their threshold voltage $V_T$ is much less than $V_o$, an approximate expression for the drain-source current of nMOSFET 214 and 216 is given by $$I_{ds2} = \frac{\beta_2}{2}[2V_0^2 - V_0^2] \approx \frac{\beta_2}{2}V_0^2$$

where $\beta_2$ is the beta of nMOSFETs 214 and 216. Substituting the above two expressions into the expression for the output impedance yields $$V_O = Z_{out}\left[\beta_1 V_{DD}V_o - \beta_1\frac{V_o^2}{2} + \beta_2\frac{V_o^2}{2}\right]$$

If the betas of transistors 208, 214 and 216 are matched and denoted by $\beta$, then the above expression yields $$Z_{out} = \frac{1}{\beta V_{DD}}$$

As seen from the above displayed equation, the output impedance of the circuit of FIG. 3a (when transistors 208, 214 and 216 are ON) is approximately constant (i.e., independent of $V_o$). A similar analysis shows that the output impedance of circuit 3b is also (approximately) given by the above displayed equation, provided the betas are also properly matched. Also note that the capacitance and inductance seen at the output node are also approximately constant, whether the driver is driving high or low. This is key to ensure that the imaginary part of the impedance also remains approximately constant, neglecting slight variations due to voltage coefficients from different levels of $V_o$. This, however, has more direct impact on the output driver slew rate than it does on impedance matching.

Figure 4:
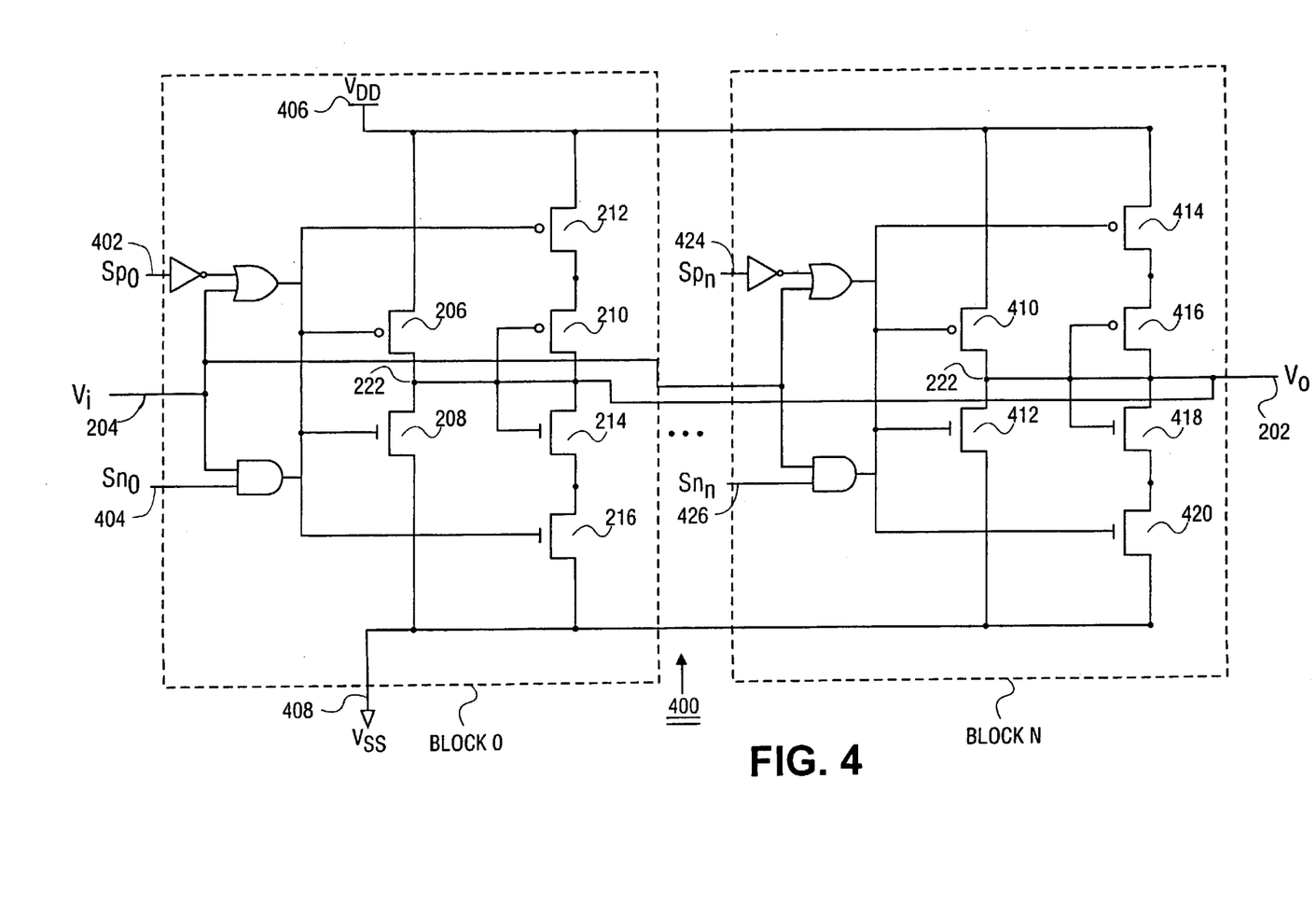
FIG. 4 is an embodiment of the present invention having programmed linear output impedance.

In another class of embodiments, in FIG. 4 transistors 206 and 208 in Block 0 may be joined by a first and second plurality of drive transistors, such as transistors 410 and 412 in Block N, respectively, so that subsets of the first and second pluralities of drive transistors can be selected so as to provide a programmable output impedance. In this case, to match betas, transistors 210, 212 (upper impedance elements), 214 and 216 (lower impedance elements) in Block 0 would be joined by a plurality of transistors, such as transistors 414, 416, (upper impedance elements), 418 and 420 (lower impedance elements), so that the proper subset of plurality transistors can be selected, depending upon the selected subset of the drive transistors, so that the output impedance is programmable and approximately independent of output voltage $V_o$.

An embodiment belonging to the previously described class of embodiments is illustrated in FIG. 4, where corresponding components in FIGS. 2 and 4 have the same numeric label. In FIG. 4, signals $Sp_0$, $Sp_n$, $Sn_0$ and $Sn_n$, on impedance select lines 402, 424, 404, and 426, respectively, are select signals. If $Sp_n$ and $Sn_n$ are LOW, and $Sp_0$ and $Sn_0$ are HIGH, then transistors associated with $Sp_n$ and $Sn_n$ are OFF and circuit 400 behaves as circuit 200 in FIG. 2. If $Sp_n$ and $Sn_n$ are each HIGH, then the transistors associated with $Sp_n$ and $Sn_n$ affect the output impedance.

To determine the output impedance when $Sp_n$, $Sn_n$, $Sp_0$ and $Sn_0$ are each HIGH, consider betas of transistors 208, 214 to be matched and denoted as $\beta_1$, the beta of 216 to be much greater than $\beta_1$, the betas of transistors 412, 418 to be matched and denoted as $\beta_2$, and that of 420 to be much greater than $\beta_2$. Then a similar analysis as discussed earlier yields the approximate expression for the output impedance, $$Z_{out} = \frac{1}{[\beta_1 + \beta_2]V_{DD}}$$

By utilizing a plurality of transmission gates, impedance select lines, and matched pairs of transistors as in FIG. 4, the output impedance can be programmed and still remain approximately independent of output voltage.

Figure 5:
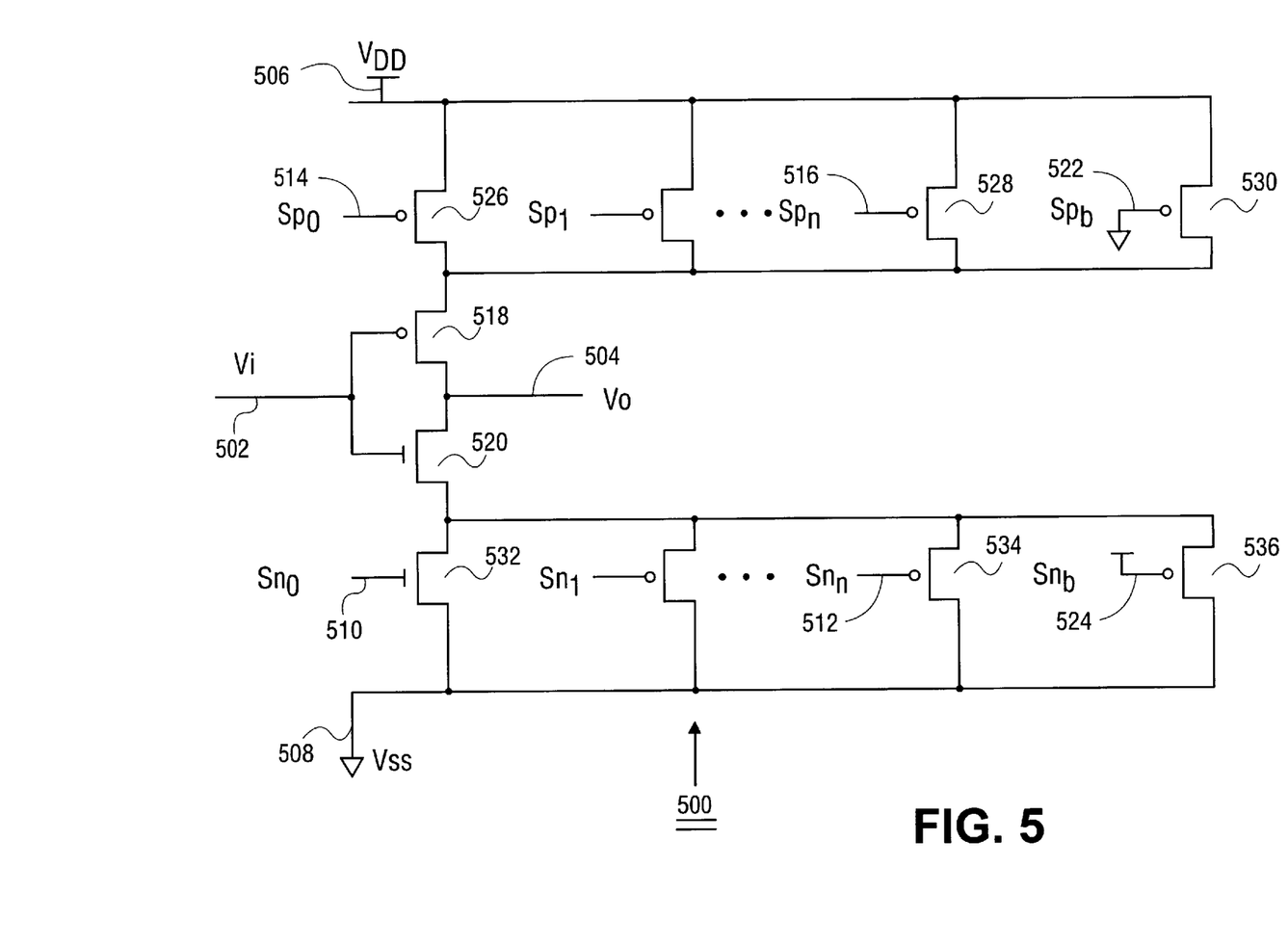
FIG. 5 is an embodiment of a pre-drive stage having programmable constant delay.
Figure 6:
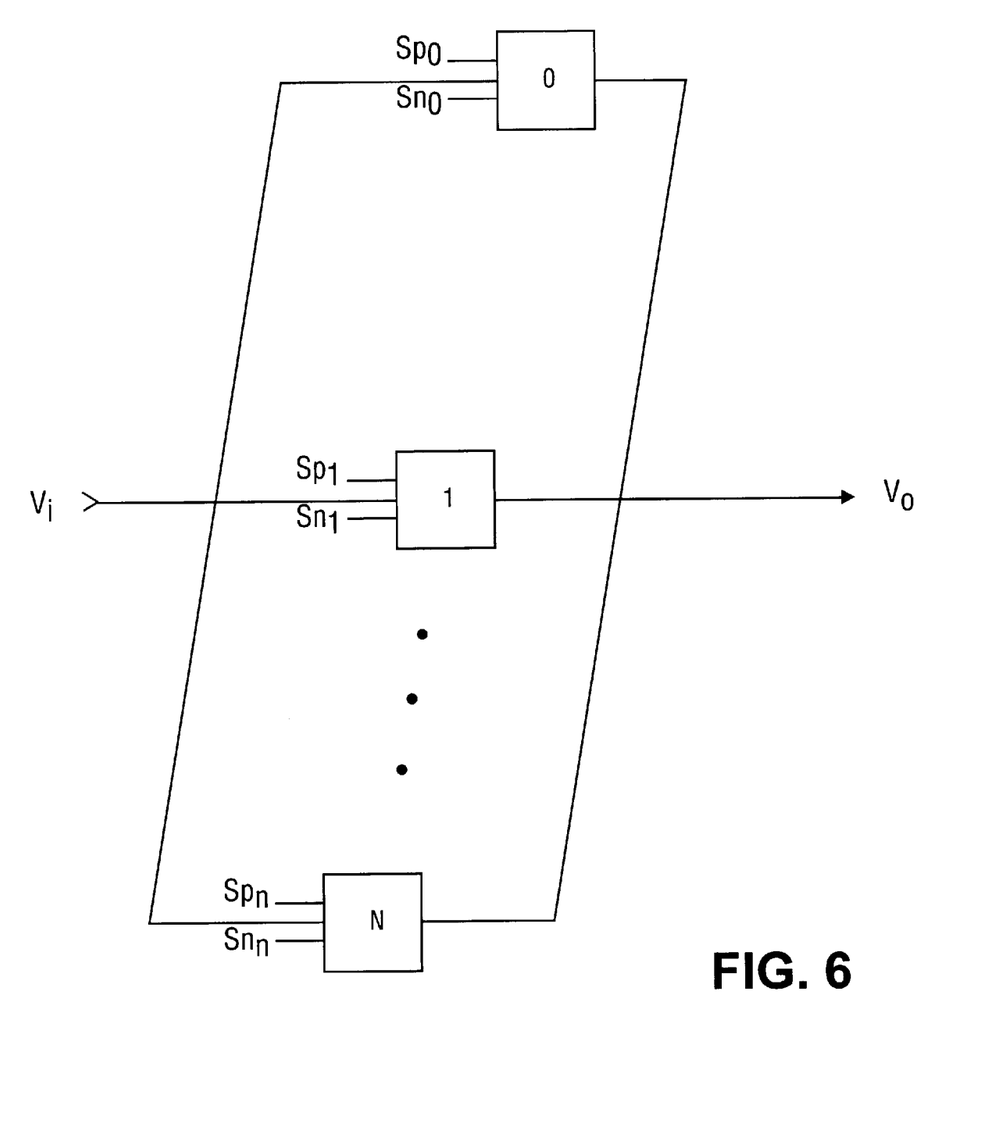
FIG. 6 is an illustration of a plurality of p-channel and n-channel stacks with delay/impedance select lines.

The circuit illustrated in FIG. 5 illustrates a pre-drive stage (502, 504, 518, 520) coupled with a programmable bias circuit that may be used with previous discussed embodiments. This embodiment of the invention features a programmable technique for keeping constant the propagation delay of the driver, which causes the propagation delay to vary from its design value. The particular operating conditions can be compensated for by programming the actual, observed delay via delay select lines $Sp_0$ (514) to $Sp_n$ (516) and $Sn_0$ (510) to $Sn_n$ (512). Note that $SP_b$ (522) and $Sn_b$ (524) are always ON. The delay value of delay select lines $Sp_0$ (514) to $Sp_n$ (516) and $Sn_0$ (510) to $Sn_n$ (512) would correspond to proportionally large transistors which they are coupled with, namely 526, 528, 532, and 534 respectively. To reduce the amount of delay (for faster operating conditions), smaller transistors and fewer delay select lines would be asserted. Contrarily, to increase the amount of delay (for slower operating conditions), larger transistors and more delay select lines would be asserted. The sensitivity at which the operating conditions are sampled determines the number of delay select lines and correspondingly how tight the interval around a nominal delay can be set to. If delay select lines $Sp_0$ (514) to $Sp_n$ (516), and $Sn_0$ (510) to $Sn_n$ (512) are OFF, then transistors 526, 528, 532, and 534 are OFF, and circuit 500 would only consist of transistors 518, 520, 530 and 536. If $Sp_0$ (514) to $Sp_n$ (516) are ON, then transistors 526, 528 affect the propagation delay. If $Sn_0$ (510) to $Sn_n$ (512) are ON, then transistors 532 and 534 affect the propagation delay. Typically, to ensure that $V_o$ is substantially equal to $V_i$, $Sn_0$ (514) and $Sn_n$ (510), are both turned on together. Accordingly, $Sp_n$ (516) and $Sn_n$ (512) would be turned ON together. The stacked configuration of the selected transistors with the actual drive transistors also serves to prevent hot electrons.

The embodiments of the invention described above are, of course, subject to other variations in structure and implementation. For instance, additional devices may be inserted between various nodes, terminals, and devices in the above embodiments without materially changing their overall function. For example, voltage drops may be introduced by resistors, diodes, or transistors configured as diodes, to change various voltage levels, or buffers may be inserted between various nodes, terminals, and devices. In general, the scope of the invention should be determined not by the embodiments illustrated but by the appended claims and their legal equivalents.

What is claimed is:

1. A circuit, comprising:
    a first drive stage having an input node, an output node, and at least one transistor coupled between the input and output nodes;
    a first impedance element coupled at one end to the output node and at another end to a first supply node, the first impedance element having a plurality of transistors each having a beta matched to a beta of the at least one transistor in the first drive stage; and
    a second impedance element coupled at one end to the output node and at another end to a second supply node, the second impedance element having a plurality of transistors each having a beta matched to the beta of the at least one transistor in the first drive stage.

2. The circuit of claim 1, wherein the first drive stage includes a p-channel MOSFET and an n-channel MOSFET.

3. The circuit of claim 1, wherein the first impedance element includes at least one first diode connected transistor in series with at least one first control transistor having an input coupled with the input node, and the second impedance element includes at least one second diode connected transistor in series with at least one second control transistor having an input coupled with the input node.

4. The circuit of claim 3, wherein the at least one first diode connected transistor is part of one of a p-channel MOSFET stack and an n-channel MOSFET stack.

5. The circuit of claim 4, wherein the betas of the at least one first diode connected transistor, the at least one first control transistor, the at least one second diode connected transistor, and the at least one second control transistor are matched.

6. The circuit of claim 5, further comprising:
    a plurality of first and second impedance elements coupled to the first drive stage;
        the plurality of first impedance elements coupled to a first impedance select line,
        the plurality of second impedance elements coupled with a second impedance select line,
        the plurality of first impedance elements and the plurality of second impedance elements are separately controllable by the first impedance select line and the second impedance select line to adjust the output impedance of the circuit.

7. The circuit of claim 6, wherein each of the plurality of first impedance elements includes at least one first diode connected transistor in series with at least one first control transistor having an input coupled with the input node, and
    each of the plurality of second impedance elements includes at least one second diode connected transistor in series with at least one second control transistor having an input coupled with the input node.

8. The circuit of claim 7, further comprising:
    a pre-drive stage; and
    a programmable bias circuit coupled to the pre-drive stage to control a current through the pre-drive stage.

9. The circuit of claim 8, wherein the pre-drive stage comprises:
    at least one transistor coupled between the input node and the output node.

10. The circuit of claim 9, wherein the programmable bias circuit comprises:
    a plurality of parallel coupled delay transistors coupled to the upper supply node;

the plurality of parallel coupled delay transistors each having a gate coupled to a delay select line, wherein the plurality of parallel coupled delay transistors are separately controlled.

11. The circuit of claim 10, wherein the pre-drive stage includes a p-channel MOSFET and an n-channel MOSFET, and the plurality of parallel coupled delay transistors is one of a p-channel MOSFET and an n-channel MOSFET.

12. A circuit, comprising:

an input node;

an output node;

a drive pMOSFET to drive the output node HIGH;

a drive nMOSFET to drive the output node LOW;

a first pMOSFET having a drain coupled with the output node;

a second pMOSFET having a drain coupled with a source of the first pMOSFET, a first nMOSPET having a drain coupled with the output node; and a second nMOSFET having a drain coupled with a source of the first nMOSFET, wherein the drive pMOSFET, the second pMOSFET and the first pMOSFET are capable of providing in combination a current conducting path from their sources to the output node, and the drive nMOSFET, the second nMOSFET and the first nMOSFET are to provide in combination a current conducting path from their sources to the output node, wherein the drive pMOSFET, the drive nMOSFET, the first pMOSFET, the second pMOSFET, the first nMOSFET and the second nMOSFET have matched betas.

13. The circuit of claim 12, further comprising:

a plurality of drive pMOSFETs each having a drain coupled with the output node, the plurality of drive pMOSFETs each having a gate coupled with a first impedance select line;

a plurality of first pMOSFETs each having a drain and a gate coupled with the output node;

a plurality of second pMOSFETs each having a drain coupled with a source of the plurality of first pMOSFETs, each of the plurality of second pMOSFETs having a gate coupled with the first impedance select line;

a plurality of drive nMOSFETs each having a drain coupled with the output node, the plurality of drive nMOSFETs each having a gate coupled with a second impedance select line;

a plurality of first nMOSFETs each having a drain and a gate coupled with the output node; and a plurality of second nMOSFETs each having a drain coupled with a source of the plurality of first nMOSFETs, each of the plurality of second nMOSFETs having a gate coupled with the second impedance select line, wherein the first impedance select line and the second impedance select line are separately controllable to adjust output impedance.

14. The circuit of claim 13, further comprising:

a plurality of delay pMOSFETs each having a source coupled with a first supply node, the plurality of pMOSFETs each having a drain coupled to a source of a first pMOSFET, the first pMOSFET having a drain coupled with the output node, a plurality of delay nMOSFETs each having a source coupled with a second supply node, the plurality of nMOSFETs each having a drain coupled to a source of a first nMOSFET, the first nMOSFET having a drain coupled with the output node, the first nMOSFET having a gate coupled to the input node, the first pMOSFET having a gate coupled to the input node, each of the plurality of delay pMOSFETs having a gate coupled to a first delay select line, each of the plurality of delay nMOSFETs having a gate coupled to a second delay select line, wherein the plurality of delay pMOSFETs and the plurality of delay nMOSFETs are separately controllable to adjust propagation delay.

15. A method comprising:

switching on a first transistor having a drain coupled with an output node;

selectively switching on a plurality of transistors coupled in parallel between a supply node and the first transistor to adjust a propagation delay through the first transistor, the plurality of transistors each having a gate coupled with a respective delay select line to separately switch on the plurality of transistors;

switching on a drive stage having an input node, an output node, and at least one transistor coupled between the input and output nodes;

selectively switching a plurality of first upper impedance elements coupled at one end to the output node and at another end to a upper supply node; and selectively switching on a plurality of lower impedance elements coupled at one end to the output node and at another end to a lower supply node to adjust impedance at the output node.

16. The method of claim 15, wherein the plurality of first impedance elements each coupled with a respective first impedance select line to separately switch on the first impedance elements, and the plurality of second impedance elements each coupled with a respective second impedance select line to separately switch on the second impedance elements.

17. The method of claim 16, wherein the drive stage includes a p-channel MOSFET and an n-channel MOSFET.

18. The method of claim 17, wherein the first transistor is one of a p-channel MOSFET and an n-channel MOSFET, and the plurality of transistors is one of a p-channel MOSFET and an n-channel MOSFET.

19. The method of claim 18, wherein the plurality of first impedance elements include at least one first diode connected transistor in series with at least one first control transistor having an input coupled with the input node, and the plurality of second impedance elements include at least one second diode connected transistor in series with at least one second control transistor having an input coupled with the input node.

20. The method of claim 19, wherein the at least one first diode connected transistor is part of one of a p-channel MOSFET stack and an n-channel MOSFET stack.

21. The method of claim 17, wherein each of the plurality of first impedance elements has a stack of transistors each having a beta matched to that of the at least one transistor in the drive stage; and the second impedance element having a stack of transistors each having a beta matched to that of the at least one transistor in the drive stage.

* * * * *